United States Patent
Park et al.

(10) Patent No.: US 8,716,754 B2
(45) Date of Patent: May 6, 2014

(54) NITRIDE SEMICONDUCTOR DEVICE

(75) Inventors: Young Hwan Park, Seoul (KR); Woo Chul Jeon, Gyeonggi-do (KR); Ki Yeol Park, Gyeonggi-do (KR); Seok Yoon Hong, Gyeonggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 54 days.

(21) Appl. No.: 13/429,148

(22) Filed: Mar. 23, 2012

(65) Prior Publication Data
US 2013/0082276 A1 Apr. 4, 2013

(30) Foreign Application Priority Data
Sep. 30, 2011 (KR) .................. 10-2011-0099795

(51) Int. Cl.
*H01L 31/072* (2012.01)

(52) U.S. Cl.
USPC ....... 257/194; 257/76; 257/192; 257/E21.403

(58) Field of Classification Search
USPC ............. 257/76–77, 192–194, 483, 330; 438/172, 191
See application file for complete search history.

(56) References Cited

U.S. PATENT DOCUMENTS

| 7,728,356 B2 | 6/2010 | Suh et al. |
| 7,816,707 B2 | 10/2010 | Hikita et al. |
| 8,384,130 B2 * | 2/2013 | Jeon et al. ............ 257/194 |
| 2007/0164314 A1 * | 7/2007 | Beach et al. ............ 257/194 |

FOREIGN PATENT DOCUMENTS

| JP | 2009-038175 | 2/2009 |
| JP | 2011-119304 | 6/2011 |

* cited by examiner

*Primary Examiner* — Dung A. Le
(74) *Attorney, Agent, or Firm* — McDermott Will & Emery LLP

(57) ABSTRACT

The present invention relates to a nitride semiconductor device One aspect of the present invention provides a nitride semiconductor device including: a nitride semiconductor layer having a 2DEG channel; a source electrode in ohmic contact with the nitride semiconductor layer; a drain electrode in ohmic contact with the nitride semiconductor layer; a p-type nitride layer formed on the nitride semiconductor layer between the source and drain electrodes; an n-type nitride layer formed on the p-type nitride layer; and a gate electrode formed between the source and drain electrodes to be close to the source electrode and in contact with the n-type nitride layer so that a source-side sidewall thereof is aligned with source-side sidewalls of the p-type and n-type nitride layers.

9 Claims, 2 Drawing Sheets

NITRIDE SEMICONDUCTOR DEVICE

CROSS-REFERENCE TO RELATED APPLICATIONS

Claim and incorporate by reference domestic priority application and foreign priority application as follows:

CROSS REFERENCE TO RELATED APPLICATION

This application claims the benefit under 35 U.S.C. Section 119 of Korean Patent Application Serial No. 10-2011-0099795, entitled filed Sep. 30, 2011, which is hereby incorporated by reference in its entirety into this application.

BACKGROUND OF THE INVENTION

1. Field of the Invention

The present invention relates to a nitride semiconductor device and a manufacturing method thereof, and more particularly, to a nitride semiconductor device with p/n-type nitride layer gate electrodes, and a manufacturing method thereof.

2. Description of the Related Art

There has been growing interest in reduction of power consumption due to green energy policy. To achieve this, improvement in power conversion efficiency is an essential element. In the power conversion, efficiency of a power switching device has influence on the entire power conversion efficiency.

At present, most of power devices generally used are power MOSFETs or IGBTs using silicon. However, an increase in efficiency of the devices is limited due to material limitations of silicon. To overcome this, there have been patent applications which are to increase the conversion efficiency by manufacturing a transistor using a nitride semiconductor such as gallium nitride (GaN).

However, a transistor having an HEMT structure using GaN becomes 'on' state in which current flows due to low resistance between drain and source when a gate voltage is 0V (normal state) and thus causes current and power consumption. In this normally-on structure, there is a disadvantage that a negative voltage (for example, −5V) should be applied to gate to convert the normally-on state into off state.

To overcome this advantage, a technique of making a normally-off structure by employing a gate electrode structure using p-type GaN on an AlGaN/GaN HEMT structure has been developed. For example, in U.S. patent U.S. Pat. No. 7,816,707, a high current device through enhanced mode and hole injection is implemented by applying p-GaN or p-AlGaN gate onto an AlGaN/GaN structure. Further, in U.S. patent U.S. Pat. No. 7,728,356, an enhanced mode GaN HEMT is implemented by applying p-GaN gate onto an AlGaN/AlN/GaN structure. That is, in U.S. Pat. No. 7,816,707 and U.S. Pat. No. 7,728,356, a GaN HFET implements normally-off by forming p-type GaN or p-type AlGaN in a gate electrode to deplete 2DEG below the gate.

SUMMARY OF THE INVENTION

However, in a conventional gate structure using p-type GaN, there is a disadvantage that leakage current of a gate terminal is increased during turn-on operation or a gate voltage sweep range is limited to lower than a built-in voltage due to the low built-in voltage of a PN junction consisting of p-type GaN of the gate terminal and a 2DEG channel region.

The present invention has been invented in order to overcome the above-described problems and it is, therefore, an object of the present invention to provide a nitride semiconductor device capable of implementing normally-off characteristics and suppressing gate leakage current by using p/n-type nitride semiconductors as gate electrodes.

In accordance with a first embodiment of the present invention to achieve the object, there is provided a nitride semiconductor device including: a nitride semiconductor layer formed by a heterojunction of a first nitride layer and a second nitride layer, which includes a material with a wider energy band gap than a material of the first nitride layer, and having a two-dimensional electron gas (2DEG) channel formed near a junction interface; a source electrode in ohmic contact with the nitride semiconductor layer; a drain electrode in ohmic contact with the nitride semiconductor layer while being spaced apart from the source electrode; a p-type nitride layer formed on the nitride semiconductor layer between the source and drain electrodes to be spaced apart from the respective source and drain electrodes; an n-type nitride layer formed on the p-type nitride layer; and a gate electrode formed between the source and drain electrodes to be close to the source electrode and in contact with the n-type nitride layer so that a source-side sidewall thereof is aligned with source-side sidewalls of the p-type and n-type nitride layers.

In another example of the present invention, the gate electrode may be in ohmic contact with the n-type nitride layer. At this time, in an example, the source, drain, and gate electrodes may be made of the same metal material.

Further, in accordance with an example, the p-type nitride layer may extend to a drain side beyond the range of a drain-side sidewall of the gate electrode.

Further, in accordance with another example of the present invention, the source-side sidewall of the gate electrode may be aligned to coincide with the source-side sidewalls of the p-type and n-type nitride layers or not to reach the source-side sidewalls of the p-type and n-type nitride layers.

Further, in an example, the p-type nitride layer may be made of a material obtained by doping the material of the first nitride layer as p-type, and the n-type nitride layer may be made of a material obtained by doping the material of the first nitride layer as n-type.

Further, in an example, the material of the first nitride layer may be GaN, the material of the second nitride layer may be AlGaN, the p-type nitride layer may be made of p-GaN, and the n-type nitride layer may be made of n-GaN.

Moreover, in accordance with another example of the present invention, the nitride semiconductor layer may be formed on a buffer layer which is formed on a substrate.

Next, in accordance with a second embodiment of the present invention to achieve the object, there is provided a method of manufacturing a nitride semiconductor device including the steps of: forming a heterojunction nitride semiconductor layer having a two-dimensional electron gas (2DEG) channel near a junction interface by a heterojunction of a first nitride layer and a second nitride layer which includes a material with a wider energy band gap than a material of the first nitride layer; forming a p-type nitride layer on a portion of the nitride semiconductor layer; forming an n-type nitride layer on the p-type nitride layer; and forming source, drain, and gate electrodes, wherein the source and drain electrodes are in ohmic contact with the nitride semiconductor layer to face each other, wherein the p-type and n-type nitride layers are interposed therebetween, and the gate electrode is disposed close to the source electrode and in contact with the n-type nitride layer so that a source-side sidewall thereof is aligned with source-side sidewalls of the p-type and n-type nitride layers.

In another example of the present invention, the gate electrode may be in ohmic contact with the n-type nitride layer. At this time, in an example, the source, drain, and gate electrodes may be made of the same metal material.

In an example, the gate electrode may be formed so that a drain-side sidewall of the gate electrode does not reach a drain-side sidewall of the p-type nitride layer.

Further, in another example of the present invention, the gate electrode may be formed so that the source-side sidewall of the gate electrode is aligned to coincide with the source-side sidewalls of the p-type and n-type nitride layers or not to reach the source-side sidewalls of the p-type and n-type nitride layers.

In accordance with another example, the p-type nitride layer may be formed by growing a material, which is obtained by doping the material of the first nitride layer as p-type, on the nitride semiconductor layer, and the n-type nitride layer may be formed by growing a material, which is obtained by doping the material of the first nitride layer as n-type, on the p-type nitride layer.

Further, in an example, the material of the first nitride layer may be GaN, and the material of the second nitride layer may be AlGaN. At this time, the p-type nitride layer may be formed by growing p-GaN on the nitride semiconductor layer, and the n-type nitride layer may be formed by growing n-GaN on the p-type nitride layer.

Moreover, in accordance with another example of the present invention, in the step of forming the nitride semiconductor layer, the nitride semiconductor layer may be formed by epitaxially growing the first and second nitride layers on a buffer layer formed on a substrate.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
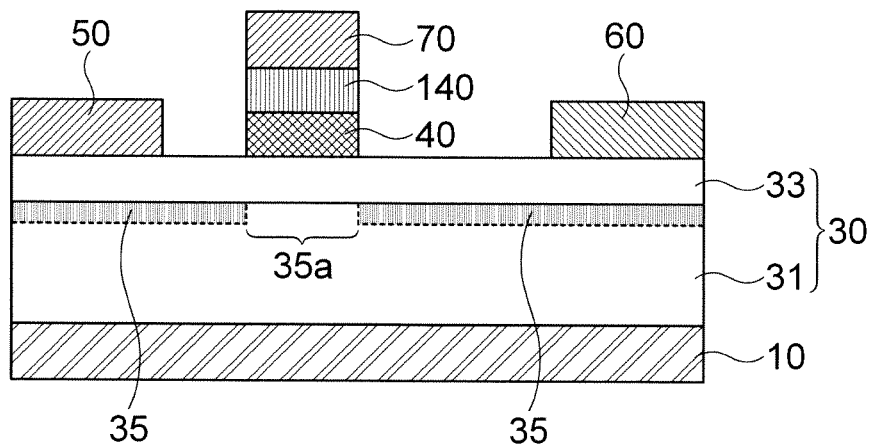
FIG. 1 is a schematic cross-sectional view of a nitride semiconductor device in accordance with an embodiment of the present invention.

Embodiments of the present invention to achieve the above objects will be described with reference to the accompanying drawings. In the following description, the same elements are represented by the same reference numerals, and additional description which is repeated or limits interpretation of the meaning of the invention may be omitted.

In this specification, when an element is referred to as being "connected or coupled to" or "disposed in" another element, it can be "directly" connected or coupled to or "directly" disposed in the other element or connected or coupled to or disposed in the other element with another element interposed therebetween, unless it is referred to as being "directly coupled or connected to" or "directly disposed in" the other element. Further, in this specification, it should be understood that when an element is referred to as being "on", "over", "above", "under", or "below" another element, it can be "directly in contact with" the other element or in contact with the other element with another element interposed therebetween, unless it is referred to as being directly in contact with the other element. In addition, the relative terms such as "on", "over", "above", "under", or "below" can be used to describe the relation of one element to the other element. At this time, when the direction of the reference element is reversed or changed, it can be used as the meaning including the concept depending on the direction of the corresponding relative terms.

Although the singular form is used in this specification, it should be noted that the singular form can be used as the concept representing the plural form unless being contradictory to the concept of the invention or clearly interpreted otherwise. It should be understood that the terms such as "having", "including", and "comprising" used herein do not preclude existence or addition of one or more other features or elements or combination thereof.

The drawings referred to in this specification are ideal exemplary drawings for describing the embodiments of the present invention, and shape, size, and thickness may be overdrawn for effective description of technical contents.

Hereinafter, a nitride semiconductor device and a manufacturing method thereof in accordance with embodiments of the present invention will be described in detail with reference to the accompanying drawings.

FIG. 1 is a schematic cross-sectional view of a nitride semiconductor device in accordance with an embodiment of the present invention. FIGS. 2a to 2d are views schematically showing a method of manufacturing the nitride semiconductor device in accordance with FIG. 1. FIG. 3 is a schematic cross-sectional view of a nitride semiconductor device in accordance with another embodiment of the present invention.

First, a nitride semiconductor device in accordance with a first embodiment of the present invention will be described with reference to FIGS. 1 and 3.

Referring to FIGS. 1 and 3, a nitride semiconductor device in accordance with an example includes a nitride semiconductor layer 30, a source electrode 50, a drain electrode 60, a p-type nitride layer 40, an n-type nitride layer 140, and a gate electrode 70. At this time, in an example, the nitride semiconductor device may be a power transistor device.

Referring to FIGS. 1 and 3, the nitride semiconductor layer 30 is formed by a heterojunction of a first nitride layer 31 and a second nitride layer 33 which includes a material with a wider energy band gap than a material of the first nitride layer 31. A two-dimensional electron gas (2DEG) channel 35 is formed near a junction interface of the nitride semiconductor layer 30. The nitride semiconductor layer 30 is a heterojunction gallium nitride semiconductor layer, and the 2DEG channel 35 is formed on the heterojunction interface by an energy band gap difference. The less the difference in lattice constant between heterojunctions in the heterojunction gallium nitride semiconductor layer 30 is, the less the differences in band gap and polarity are. Due to this, the formation of the 2DEG channel 35 may be suppressed. Free electrons move from a material with a wide band gap to a material with a small band gap by discontinuity of the energy band gap during heterojunction. These electrons are accumulated on the heterojunction interface to form the 2DEG channel 35 so that current flows between the drain electrode 60 and the source electrode 50.

In an example, a nitride constituting the nitride semiconductor layer 30 may be gallium nitride (GaN), aluminum gallium nitride (AlGaN), indium gallium nitride (InGaN), or indium aluminum gallium nitride (InAlGaN) but not limited thereto. The second nitride layer 33 is in heterojunction with the first nitride layer 31 and includes a heterogeneous gallium nitride material with a wider energy band gap than the first nitride layer 31. At this time, the second nitride layer 33 plays a role of supplying electrons to the 2 DEG channel 35 formed in the first nitride layer 31. In an example, the second nitride layer 33, which donates electrons, may be formed with a thickness smaller than that of the first nitride layer 31.

At this time, in an example, the first nitride layer 31 may include gallium nitride (GaN), and the second nitride layer 33 may include one of aluminum gallium nitride (AlGaN), indium gallium nitride (InGaN), and indium aluminum gallium nitride (InAlGaN). For example, the material of the first nitride layer 31 may include gallium nitride (GaN), and the material of the second nitride layer 33 may include (AlGaN).

In accordance with an example, as shown in FIGS. 1 and/or 3, the first nitride layer 31 of the nitride semiconductor layer 30 may be disposed on a substrate 10. At this time, generally, the substrate 10 may be an insulating substrate or a high resistance substrate substantially having insulation property. For example, the substrate 10 may be manufactured using at least one of silicon (Si), silicon carbide (SiC), and sapphire ($Al_2O_3$) or other well-known substrate materials. In an example, the nitride semiconductor layer 30 may be formed by epitaxially growing a single crystal thin film on the substrate 10.

In accordance with another example, although not shown, a buffer layer may be provided between the substrate 10 and the nitride semiconductor layer 30, and the nitride semiconductor layer 30 may be formed on the buffer layer. At this time, the nitride semiconductor layer 30 may be formed by epitaxially growing a single crystal thin film on the buffer layer (not shown). The buffer layer (not shown) is provided so as to overcome problems due to a lattice mismatch between the substrate 10 and the nitride semiconductor layer 30. The buffer layer may be formed in one layer as well as a plurality of layers including gallium nitride (GaN), aluminum gallium nitride (AlGaN), aluminum nitride (AlN), indium gallium nitride (InGaN), or indium aluminum gallium nitride (InAlGaN). Further, the buffer layer may be made of group III-V compound semiconductors other than gallium nitride. For example, when the substrate 10 is a sapphire substrate, growth of the buffer layer is important to avoid a mismatch due to differences in lattice constant and coefficient of thermal expansion between the substrate 10 and the nitride semiconductor layer 30 including gallium nitride.

Referring to FIGS. 1 and 3, the source electrode 50 is in ohmic contact with the nitride semiconductor layer 30. Further, the drain electrode 60 is in ohmic contact with the nitride semiconductor layer 30 while being spaced apart from the source electrode 50.

At this time, the source electrode 50 and the drain electrode 60 may be formed using metal, metal silicide, or alloys thereof. For example, the source electrode 50 and the drain electrode 60 may be formed using at least one metal of aluminum (Al), molybdenum (Mo), gold (Au), nickel (Ni), platinum (Pt), titanium (Ti), palladium (Pd), iridium (Ir), rhodium (Rh), cobalt (Co), tungsten (W), tantalum (Ta), copper (Cu), and zinc (Zn), metal silicide, and alloys thereof.

Continuously, referring to FIGS. 1 and 3, the p-type nitride layer 40 is formed on the nitride semiconductor layer 30 between the source and drain electrodes 50 and 60 to be spaced apart from the respective source and drain electrodes 50 and 60.

Further, referring to FIGS. 1 and 3, the n-type nitride layer 140 is formed on the p-type nitride layer 40. At this time, the n-type nitride layer 140 is n+ doped to reduce contact resistance when the gate electrode 70 is formed.

In accordance with this embodiment, 2DEG is depleted in a region, where the p-type nitride layer 40, for example, p-GaN is formed, to implement normally-off characteristics. Further, a 2DEG region and p-type/n-type nitride layer gates, for example, p-GaN/n-GaN gates form an npn junction to suppress gate leakage current in turn-off. Further, the 2DEG region and the p-type/n-type nitride layer gate structures increase a gate sweep voltage to improve turn-on current.

Referring to FIG. 3, in an example, the p-type nitride layer 40 may extend to a drain side beyond the range of a drain-side sidewall of the gate electrode 70. At this time, the n-type nitride layer 140 formed on the p-type nitride layer 40 may extend to the drain side beyond the range of the drain-side sidewall of the gate electrode 70 like the p-type nitride layer 40.

Further, in an example, a material of the p-type nitride layer 40 may be p-type doped gallium nitride (GaN), aluminum gallium nitride (AlGaN), indium gallium nitride (InGaN), or indium aluminum gallium nitride (InAlGaN) but not limited thereto. Further, a material of the n-type nitride layer 140 may be n-type doped gallium nitride (GaN), aluminum gallium nitride (AlGaN), indium gallium nitride (InGaN), or indium aluminum gallium nitride (InAlGaN) but not limited thereto.

At this time, in accordance with an example, the p-type nitride layer 40 may be made of a p-type semiconductor material obtained by doping the material of the first nitride layer 31 as p-type. Further, the n-type nitride layer 140 may be made of an n-type semiconductor material obtained by doping the material of the first nitride layer 31 as n-type. For example, the material of the first nitride layer 31 may include gallium nitride (GaN), and the p-type nitride layer 40 may be made of p-GaN. Further, the n-type nitride layer 140 may be made of n-GaN.

And, referring to FIGS. 1 and 3, the gate electrode 70 is formed between the source and drain electrodes 50 and 60 to be close to the source electrode 50. At this time, the gate electrode 70 is in contact with the n-type nitride layer 140 so that a source-side sidewall thereof is aligned with source-side sidewalls of the p-type and n-type nitride layers 40 and 140.

At this time, the gate electrode 70 may be formed using metal, metal silicide, or alloys thereof. For example, the gate electrode 70 may be formed using at least one metal of aluminum (Al), molybdenum (Mo), gold (Au), nickel (Ni), platinum (Pt), titanium (Ti), palladium (Pd), iridium (Ir), rhodium (Rh), cobalt (Co), tungsten (W), tantalum (Ta), copper (Cu), and zinc (Zn), metal silicide, and alloys thereof.

In an example, the gate electrode 70 may be in ohmic contact with the n-type nitride layer 140. Since the second nitride layer 33, the p-type nitride layer 40, and the n-type nitride layer 140 form an npn structure, the gate electrode 70 may be in ohmic contact like the source and drain electrodes 50 and 60.

In an example, in case of ohmic-contact, the gate electrode 70 and the source and drain electrodes 50 and 60 may be made of the same metal material.

Further, in accordance with an example, as shown in FIGS. 1 and 3, the source-side sidewall of the gate electrode 70 may be aligned to coincide with the source-side sidewalls of the p-type and n-type nitride layers 40 and 140 or although not shown, the source-side sidewall of the gate electrode 70 may be aligned not to reach the source-side sidewalls of the p-type and n-type nitride layers 40 and 140.

In accordance with an embodiment of the present invention, it is possible to implement a high withstand voltage/high current normally-off device by using p-type/n-type nitride layer gates. For example, it is possible to implement a high power device.

In accordance with an embodiment of the present invention, it is possible to implement normally-off characteristics and suppress gate leakage current by using p/n-type nitride semiconductors as gate electrodes.

By forming gate electrodes having p-type/n-type nitride layer structures proposed according to an embodiment of the present invention, an npn structure is formed so that gate leakage current can be limited by an np diode which is reversely driven and thus a gate sweep voltage can be increased. Accordingly, turn-on current can be increased.

Further, by using the same metal material as the source and drain electrodes 50 and 60 in the gate electrode 70, it is possible to form all the electrodes at a time. Accordingly, manufacturing processes can be simplified.

Next, a method of manufacturing a nitride semiconductor device in accordance with a second embodiment will be described with reference to FIGS. 2a to 2d. At this time, the embodiments of the above-described nitride semiconductor device and FIGS. 1 and 3 will be referenced. Accordingly, repeated description will be omitted.

Referring to FIGS. 2a to 2d, a method of manufacturing a nitride semiconductor device includes a heterojunction nitride semiconductor layer forming step, a p-type nitride layer forming step, an n-type nitride layer forming step, and an electrode forming step. At this time, in an example, the nitride semiconductor device may be a power transistor device.

Figure 2A:
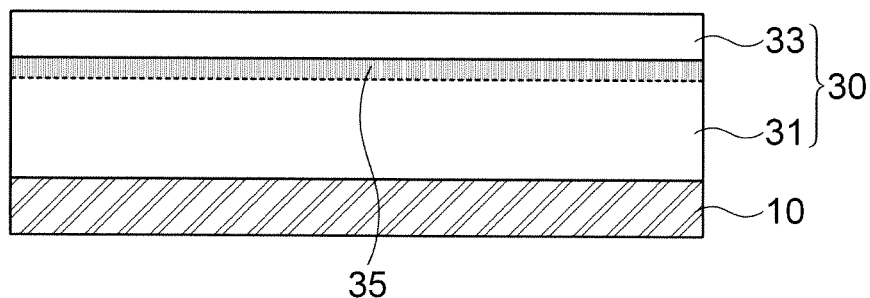
FIGS. 2a to 2d are views schematically showing a method of manufacturing the nitride semiconductor device in accordance with FIG. 1.
Figure 3:
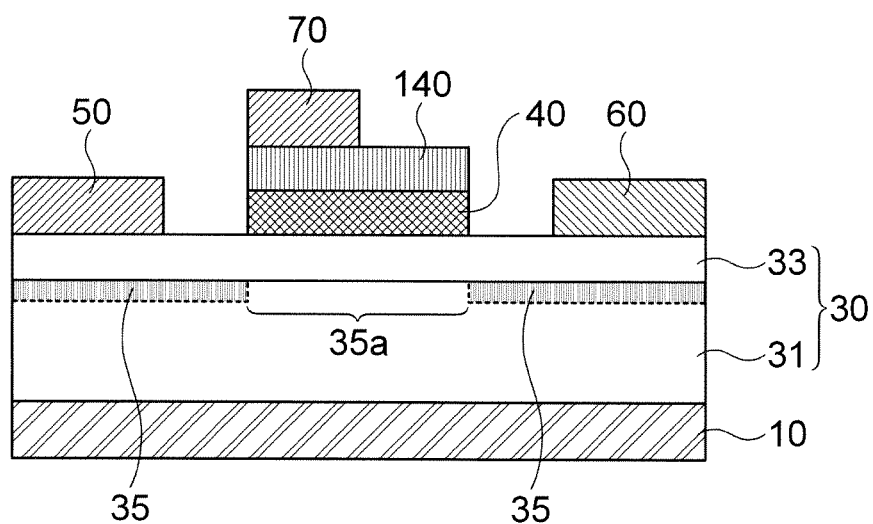
FIG. 3 is a schematic cross-sectional view of a nitride semiconductor device in accordance with another embodiment of the present invention.

Referring to FIG. 2a, in the heterojunction nitride semiconductor layer forming step, a nitride semiconductor layer 30 is formed by a heterojunction of a first nitride layer 31 and a second nitride layer 33 which includes a material with a wider energy band gap than a material of the first nitride layer 31. At this time, a two-dimensional electron gas (2DEG) channel is formed near a heterojunction interface of the nitride semiconductor layer 30. The second nitride layer 33 plays a role of supplying electrons to the 2DEG channel 35 formed in the first nitride layer 31. In an example, the second nitride layer 33, which donates electrons, may be formed with a thickness smaller than that of the first nitride layer 31.

In an example, a nitride used in the nitride semiconductor layer 30 may be gallium nitride (GaN), aluminum gallium nitride (AlGaN), indium gallium nitride (InGaN), or indium aluminum gallium nitride (InAlGaN) but not limited thereto. The second nitride layer 33 is in heterojunction with the first nitride layer 31 and includes a heterogeneous gallium nitride material with a wider energy band gap than the first nitride layer 31.

Further, in an example, the first nitride layer 31 may include gallium nitride (GaN), and the second nitride layer 33 may include one of aluminum gallium nitride (AlGaN), indium gallium nitride (InGaN), and indium aluminum gallium nitride (InAlGaN). For example, the material of the first nitride layer 31 may include gallium nitride (GaN), and the material of the second nitride layer 33 may include aluminum gallium nitride (AlGaN).

Further, in an example, as shown in FIGS. 1 and 3, the nitride semiconductor layer 30 may be formed on a substrate 10. At this time, the substrate 10 may be manufactured using at least one of silicon (Si), silicon carbide (SiC), and sapphire (Al$_2$O$_3$) or other well-known substrate materials. At this time, the nitride semiconductor layer 30 may be formed by epitaxially growing a nitride single crystal thin film. That is, the first nitride layer 31 and the second nitride layer 33 may be formed by an epitaxial growth process. For example, the first nitride layer 31 may be formed by epitaxially growing a gallium nitride single crystal thin film on the substrate 10, and the second nitride layer 33 may be formed by epitaxially growing a heterogeneous gallium nitride single crystal thin film on the first nitride layer 31.

Further, although not shown, the nitride semiconductor layer 30 may be formed on a buffer layer formed on the substrate 10. At this time, the first nitride layer 31 may be epitaxially grown on the buffer layer after epitaxially growing the buffer layer on the substrate 10. Next, the second nitride layer 33 may be formed by epitaxially growing a nitride layer including a heterogeneous gallium nitride material with a wider energy band gap than the first nitride layer 31 by using the first nitride layer 31 as a seed layer.

At this time, in an example, the first nitride layer 31 may be formed by epitaxially growing gallium nitride single crystal including gallium nitride (GaN), and the second nitride layer 33 may be formed by epitaxially growing gallium nitride single crystal including one of aluminum gallium nitride (AlGaN), indium gallium nitride (InGaN), and indium aluminum gallium nitride (InAlGaN). For example, the second nitride layer 33 may be formed by epitaxially growing aluminum gallium nitride (AlGaN).

The first and second nitride layers 31 and 33 may be formed by an epitaxial growth process such as liquid phase epitaxy (LPE), chemical vapor deposition (CVD), molecular beam epixaxy (MBE), or metal-organic CVD (MOCVD). The nitride semiconductor layer 30 is selectively grown during the epitaxial growth so as not to be overgrown. If the nitride semiconductor layer 30 is overgrown, it may be additionally planarized by an etch-back process or a chemical mechanical polishing (CMP) process.

Figure 2B:
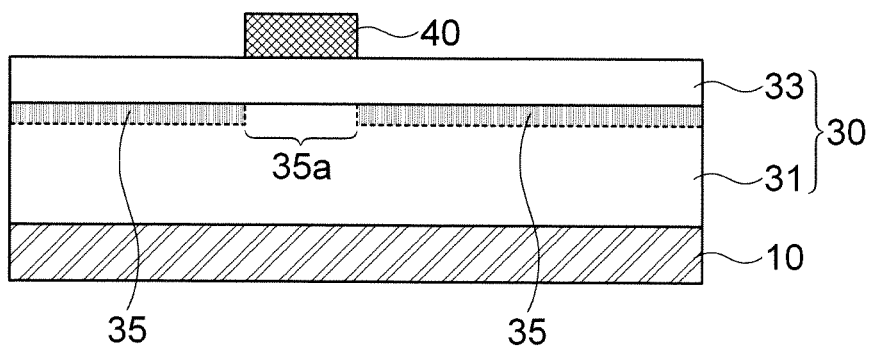

Referring to FIG. 2b, in the p-type nitride layer forming step, a p-type nitride layer 40 is formed on a portion of the nitride semiconductor layer 30.

Figure 2C:
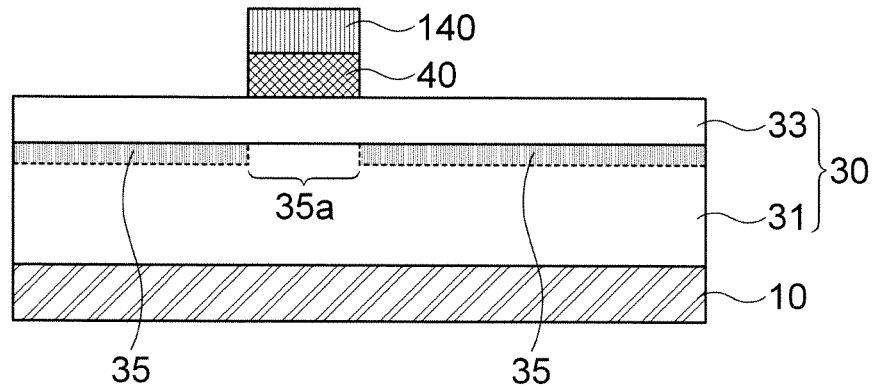

Referring to FIG. 2c, in the n-type nitride layer forming step, an n-type nitride layer 140 is formed on the p-type nitride layer 40. At this time, the n-type nitride layer 140 is n+ doped to reduce contact resistance when a gate electrode 70 is formed.

In accordance with this embodiment, 2DEG is depleted in a region, where the p-type nitride layer 40, for example, p-GaN is formed, to implement normally-off characteristics. Further, a 2DEG region and p-type/n-type nitride layer gates, for example, p-GaN/n-GaN gates form an npn junction to suppress gate leakage current in turn-off. Further, the 2DEG region and the p-type/n-type nitride layer gate structures increase a gate sweep voltage to improve turn-on current.

Further, in an example, a material of the p-type nitride layer 40 may be p-type doped gallium nitride (GaN), aluminum gallium nitride (AlGaN), indium gallium nitride (InGaN), or indium aluminum gallium nitride (InAlGaN) but not limited thereto. Further, a material of the n-type nitride layer 140 may be n-type doped gallium nitride (GaN), aluminum gallium nitride (AlGaN), indium gallium nitride (InGaN), or indium aluminum gallium nitride (InAlGaN) but not limited thereto.

At this time, in accordance with an example, the p-type nitride layer 40 may be made of a p-type semiconductor material obtained by doping the material of the first nitride layer 31 as p-type. At this time, the p-type nitride layer 40 may be formed by epitaxially growing the p-type semiconductor material doped as p-type on the nitride semiconductor layer 30, that is, the second nitride layer 33. Further, the n-type nitride layer 140 may be made of an n-type semiconductor material obtained by doping the material of the first nitride layer 31 as n-type. At this time, the n-type nitride layer 140 may be formed by epitaxially growing the n-type semiconductor material doped as n-type on the p-type nitride layer 40. For example, the material of the first nitride layer 31 may include gallium nitride (GaN), and the p-type nitride layer 40 may be formed by growing p-GaN on the nitride semiconductor layer 30. Further, the n-type nitride layer 140 may be formed by growing n-GaN on the p-type nitride layer 40.

Figure 2D:
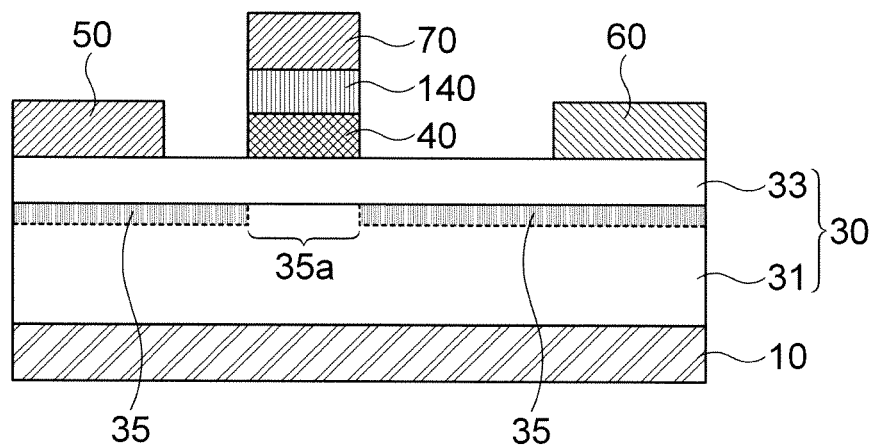

Referring to FIG. 2d, in the electrode forming step, source, drain, and gate electrodes, 50, 60, and 70 are formed. At this time, the source and drain electrodes 50 and 60 are formed on the nitride semiconductor layer 30 to face each other with the p-type and n-type nitride layers 40 and 140 interposed therebetween and in ohmic contact with the nitride semiconductor layer 30. Further, the gate electrode 70 is disposed close to the source electrode 50, and a source-side sidewall thereof is in contact with the n-type nitride layer 140 to be aligned with source-side sidewalls of the p-type and n-type nitride layers 40 and 140.

At this time, the source, drain, and gate electrodes 50, 60, and 70 may be formed using metal, metal silicide, or alloys thereof. For example, the source, drain, and gate electrodes 50, 60, and 70 may be formed using at least one metal of aluminum (Al), molybdenum (Mo), gold (Au), nickel (Ni), platinum (Pt), titanium (Ti), palladium (Pd), iridium (Ir), rhodium (Rh), cobalt (Co), tungsten (W), tantalum (Ta), copper (Cu), and zinc (Zn), metal silicide, and alloys thereof.

In an example, the gate electrode 70 may be in ohmic contact with the n-type nitride layer 140. Since the second nitride layer 33, the p-type nitride layer 40, and the n-type nitride layer 140 form an npn structure, the gate electrode 70 may be in ohmic contact like the source and drain electrodes 50 and 60.

In an example, the source, drain, and gate electrodes 50, 60, and 70 may be made of the same metal material.

Further, in an example, referring to FIG. 3, the gate electrode 70 may be formed so that a drain-side sidewall of the gate electrode 70 does not reach a drain-side sidewall of the p-type nitride layer 40. That is, the drain-side sidewall of the p-type nitride layer 40 is disposed on the nitride semiconductor layer 30 beyond the drain-side sidewall of the gate electrode 70. Further, at this time, a drain-side sidewall of the n-type nitride layer 140 may be formed to be aligned with the drain-side sidewall of the p-type nitride layer 40. At this time, the drain-side sidewall of the gate electrode 70 does not reach the drain-side sidewall of the n-type nitride layer 140.

In another example, as shown in FIGS. 1, 2d, and 3, the gate electrode 70 may be formed so that the source-side sidewall of the gate electrode 70 is aligned to coincide with the source-side sidewalls of the p-type and n-type nitride layers 40 and 140 or although not shown, the gate electrode 70 may be formed so that the source-side sidewall of the gate electrode 70 is aligned not to reach the source-side sidewalls of the p-type and n-type nitride layers 40 and 140.

By forming gate electrodes having p-type/n-type nitride layer structures proposed according to an embodiment of the present invention, an npn structure is formed so that gate leakage current can be limited by an np diode which is reversely driven and thus a gate sweep voltage can be increased. Accordingly, turn-on current can be increased.

Further, by using the same metal material as the source and drain electrodes 50 and 60 in the gate electrode 70, it is possible to form all the electrodes at a time. Accordingly, manufacturing processes can be simplified.

In accordance with one aspect of the present invention, it is possible to implement normally-off characteristics and suppress gate leakage current by using p/n-type nitride semiconductors as gate electrodes.

A normally-off type FET with p-type/n-type nitride layer gate electrodes in accordance with an embodiment of the present invention has low leakage current and a high gate sweep voltage compared to a conventional method so that it is possible to increase turn-on current.

Further, in accordance with an embodiment of the present invention, it is possible to simplify manufacturing processes by forming electrodes in source/drain/gate terminals with the same metal material.

Although not explicitly described as preferable one aspect of the present invention, embodiments of the present invention in accordance with possible various combinations of the above-described technical features can be apparently implemented by those skilled in the art.

The above-described embodiments and the accompanying drawings are provided as examples to help understanding of those skilled in the art, not limiting the scope of the present invention. Therefore, the various embodiments of the present invention may be embodied in different forms in a range without departing from the essential concept of the present invention, and the scope of the present invention should be interpreted from the invention defined in the claims. It is to be understood that the present invention includes various modifications, substitutions, and equivalents by those skilled in the art.

What is claimed is:

1. A nitride semiconductor device comprising:
   a nitride semiconductor layer formed by a heterojunction of a first nitride layer and a second nitride layer, which includes a material with a wider energy band gap than a material of the first nitride layer, and having a two-dimensional electron gas (2DEG) channel formed near a junction interface;
   a source electrode in ohmic contact with the nitride semiconductor layer;
   a drain electrode in ohmic contact with the nitride semiconductor layer while being spaced apart from the source electrode;
   a p-type nitride layer formed on the nitride semiconductor layer between the source and drain electrodes to be spaced apart from the respective source and drain electrodes;
   an n-type nitride layer formed on the p-type nitride layer; and
   a gate electrode formed between the source and drain electrodes to be close to the source electrode and in contact with the n-type nitride layer so that a source-side sidewall thereof is aligned with source-side sidewalls of the p-type and n-type nitride layers.

2. The nitride semiconductor device according to claim 1, wherein the gate electrode is in ohmic contact with the n-type nitride layer.

3. The nitride semiconductor device according to claim 2, wherein the source, drain, and gate electrodes are made of the same metal material.

4. The nitride semiconductor device according to claim 1, wherein the p-type nitride layer extends to a drain side beyond the range of a drain-side sidewall of the gate electrode.

5. The nitride semiconductor device according to claim 1, wherein the source-side sidewall of the gate electrode is aligned to coincide with the source-side sidewalls of the p-type and n-type nitride layers or not to reach the source-side sidewalls of the p-type and n-type nitride layers.

6. The nitride semiconductor device according to claim 1, wherein the p-type nitride layer is made of a material obtained by doping the material of the first nitride layer as p-type, and the n-type nitride layer is made of a material obtained by doping the material of the first nitride layer as n-type.

7. The nitride semiconductor device according to claim 1, wherein the material of the first nitride layer is GaN, and the material of the second nitride layer is AlGaN.

8. The nitride semiconductor device according to claim 7, wherein the p-type nitride layer is made of p-GaN, and the n-type nitride layer is made of n-GaN.

9. The nitride semiconductor device according to claim 1, wherein the nitride semiconductor layer is formed on a buffer layer which is formed on a substrate.

* * * * *